Inventors
Wilbert H. Budd
Robert A. Stackhouse
Hilbert L. Slough
By Ira Milton Jones
Attorney March 27, 1956 W. H. BUDD ET AL 2,740,027

RADIO AND TELEVISION RECEIVER COMPONENT ADAPTED ESPECIALLY FOR USE WITH PRINTED WIRING

Filed Dec. 4, 1953 2 Sheets-Sheet 2

Inventors
Wilbert H. Budd
Robert A. Stackhouse
Hilbert L. Slough
By Ira Milton Jones
Attorney United States Patent Office 2,740,027

Patented Mar. 27, 1956

2,740,027

RADIO AND TELEVISION RECEIVER COMPONENT ADAPTED ESPECIALLY FOR USE WITH PRINTED WIRING

Wilbert H. Budd, Robert A. Stackhouse, and Hilbert L. Slough, Elkhart, Ind., assignors to Chicago Telephone Supply Corporation, Elkhart, Ind., a corporation of Indiana Application December 4, 1953, Serial No. 396,296

6 Claims. (Cl. 201—55)

This invention relates to radio and television receiver components designed especially for use with printed wiring and has as its purpose to provide an improved manner of mounting such components upon the panels on which the wiring is printed to facilitate the connection of the components in their respective circuits printed on the panels.

Heretofore it has been the practice to mount components of radio and television receivers such as volume controls and combination variable resistors and switches by means of threaded bushings and clamping nuts threaded thereon, or by twisted or clinched attaching ears. These conventional methods of mounting such components upon a supporting panel or chassis are not well adapted to mechanized assembly and are not well suited for use with the prefabricated or printed circuits now being adopted by many manufacturers of television and radio apparatus, especially for the smaller portable sets where space is at a premium and production costs are extremely important.

The present invention thus has as its object to provide a way in which a control unit or circuit component of the character described may be quickly and easily mounted upon a printed circuit panel with the terminals of the control or circuit component protruding through holes in the panel for soldered connection with their respective leads.

Such disposition of the circuit component and more especially a variable resistor is illustrated in the copending application of Mervin B. Arisman, Serial No. 403,401, filed January 11, 1954. The present invention thus does not reside in the described relationship between the circuit component and the printed circuit panel but rather in the mounting of the circuit component or control on the panel in a manner which not only assures proper positional relationship between the terminals of the control and the printed wiring on the panel but also provides a sufficiently secure mechanical mounting to obviate the need for additional mechanical support for the component or control.

More specifically it is an object of this invention to provide snap-in detent-like tabs or tangs on a portion of the control or circuit component to have a detent-like engagement with suitably shaped and located holes in the printed circuit panel and thereby hold the control or component with its terminals in position to be soldered to their respective leads which are printed on the panel.

While the invention in its broadest aspect contemplates the mounting of any of the various components of a television or radio receiver circuit, which cannot be supplied in prefabricated or printed form on the panel, it is especially concerned with the mounting of variable resistors and variable resistor and switch combinations in which a single control shaft serves to adjust the resistor and also effect opening and closing of the switch.

Accordingly, it is another object of this invention to provide the housing of a variable resistor either directly or indirectly with spaced legs which have panel engaging surfaces lying in a common plane which intersects the terminals of the resistor and from which resilient snap-in tabs or fingers project to have detent-like engagement in appropriately shaped and located holes in a printed circuit panel to thereby secure the variable resistor to the panel with its terminals protruding through the panel and in position to be easily soldered to the wiring printed on the panel.

Another object of this invention resides in the provision of a novel mounting bracket having a pair of opposite legs joined by a wall adapted to serve as a ground plate for a variable resistor, the legs having supporting surfaces or shoulders lying in a common plane substantially parallel to the axis of the control shaft to position the control upon a panel with its shaft parallel thereto, in which position it is held by tabs or tangs snapped into holes or slots in the panel, and wherein the bracket is also equipped with mounting ears by which the control may be secured to a chassis wall or the like with its shaft passing through such wall.

With the above and other objects in view, which will appear as the description proceeds, this invention resides in the novel construction, combination and arrangement of parts substantially as hereinafter described and more particularly defined by the appended claims, it being understood that such changes in the precise embodiment of the hereindisclosed invention may be made as come within the scope of the claims.

The accompanying drawings illustrate several complete examples of the physical embodiments of the invention constructed according to the best modes so far devised for the practical application of the principles thereof, and in which.

Figures 1, 2, 3:
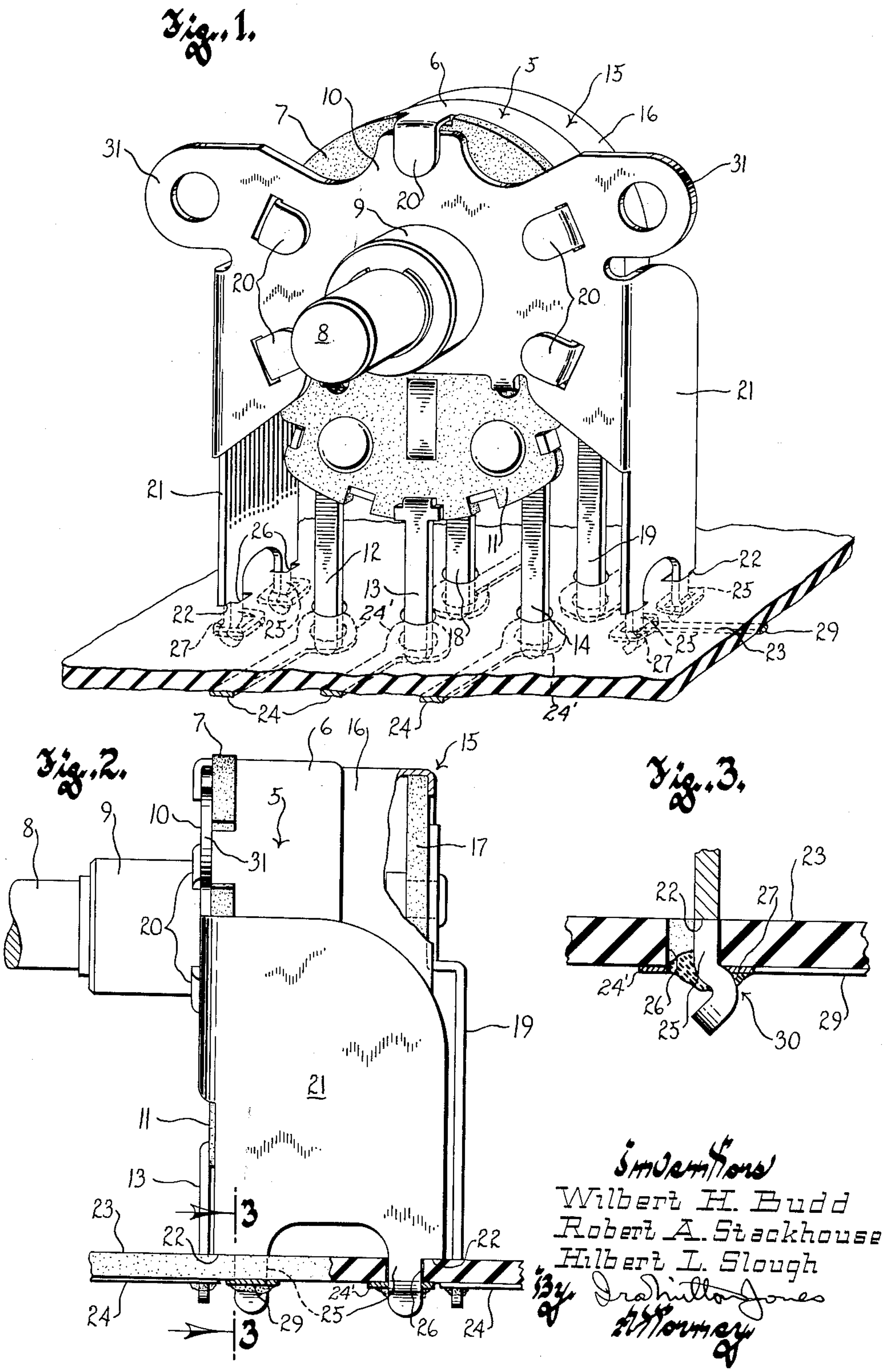
Figure 1 is a perspective view of a combined variable resistor and switch embodying this invention and illustrating the same mounted upon a printed wiring panel.
Figure 2 is a side view of the mounted control unit.
Figure 3 is an enlarged detail sectional view through Figure 2 on the plane of the line 3—3.
Figure 4:
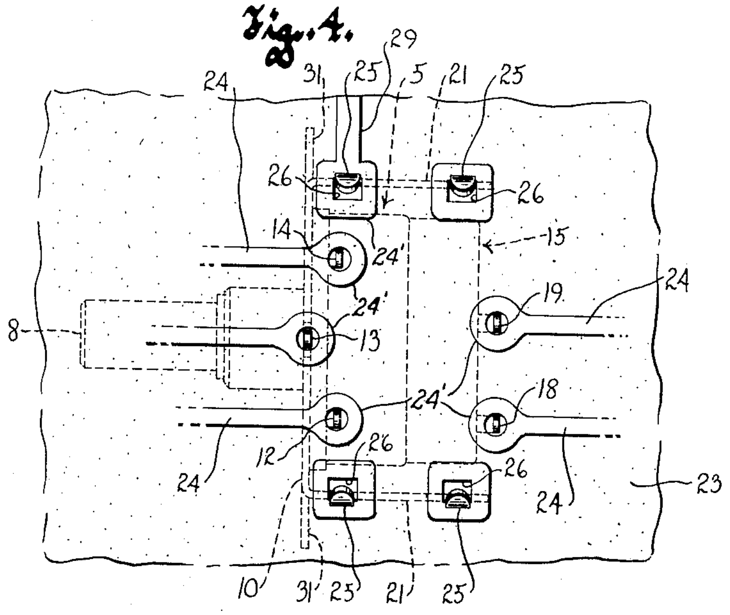
Figure 4 is a bottom view of the panel with the control shown in dotted lines thereabove and illustrating the manner in which portions of the printed wiring connect with the terminals of the control.

Referring now particularly to the accompanying drawings, the numeral 5 designates generally a variable resistor of more or less conventional type wherein the instrumentalities of the control (not shown) are enclosed within a housing comprising a stamped metal cup-shaped casing 6 and a front wall 7 of insulating material extending across and secured to the front of the casing. The control instrumentalities of the variable resistor are adjusted by a rotatable control shaft 8 which is ordinarily journalled in a bushing 9 carried by a ground plate 10. The bushing 9 may be formed as an integral part of the ground plate, or, as in the present instance, it may be a separate unit secured to the ground plate.

The front wall 7 of the control provides the insulated base for the unit and ordinarily has a radially outwardly extending terminal support 11 to which the terminals 12, 13 and 14 of the resistor are secured. In this case these terminals are parallel with one another and project straight out from the terminal support 11 in directions normal to the axis of the control shaft.

Since the instrument illustrated is a combined volume control and switch, a switch designated generally by the numeral 15 is mounted on the back of the variable resistor, and as is customary, its mechanism is enclosed within a generally cylindrical housing 16 having an end wall 17 of insulating material. This end wall provides the base for the switch and has the switch terminals 18 and 19 secured thereto. These terminals are parallel to the resistor terminals and thus extend in directions normal to the axis of the control shaft.

The ground plate 10 overlies the front wall or base 7 of the variable resistor where it is secured by tangs 20 extended from the edge of the casing 6 through holes in the ground plate 10 and struck over the front face of the plate. The ground plate is part of a stamped and formed mounting bracket having a pair of opposite substantially parallel legs 21 spaced apart a distance to embrace the entire control unit. The legs extend in the same direction as the terminals of the resistor and switch and preferably are at right angles to the ground plate 10 which connects them.

The bottom edges or surfaces 22 of the supporting legs lie in a common plane parallel to the control shaft axis and normal to the direction in which the terminals and supporting legs 21 extend so that when seated on or bearing against a panel 23 upon which the instrument is to be mounted the control shaft is parallel to the panel and the terminals project toward the panel.

The terminals are all long enough to project beyond the plane of the supporting surfaces 22 so as to protrude through holes in the panel when the instrument is in place thereon. Hence, the ends of the terminals may be soldered to wiring 24 printed on the panel. Ordinarily this wiring is printed on the side of the panel opposite that at which the components are located and to assure good soldered connections between the terminals and their respective printed leads, the edges of the holes in the panel through which the terminals protrude are bounded by rings 24′ of the printed conducting material.

To enable quick and easy assembly of the control instrument with the panel 23 and to hold the same thereon with its various terminals in position to be soldered to their respective leads is the chief purpose of this invention, and to this end the supporting legs 21 are equipped with resilient fingers 25 which project beyond the supporting surfaces 22 and are shaped to have snap-in detent-like engagement with the edges of holes 26 in the panel. To provide this detent-like action the outer ends of the fingers 25 are formed with shoulders 27 so spaced from the plane of the supporting surfaces 22 that they wedge against the edges of the holes 26 and draw the surfaces firmly against the panel when the fingers are snapped into their respective holes. Obviously, of course, the holes 26 must be large enough to accommodate the enlarged outer end portions of the spring fingers.

Inasmuch as the spring fingers 25 hold the instrument firmly on the panel 23 there is no need for using special fixtures or jigs during the soldering of the several terminals to their respective printed leads, which may be done by any of the various techniques that have been developed by set manufacturers for this purpose.

If desired, one or more of the spring fingers or tabs 25 may be soldered to a ground connection 29 which, like the rest of the wiring, is printed on the face of the panel opposite that at which the instrument is mounted. Such securement of the fingers or tabs 25, as shown at 30 in Figure 3, will augment the holding effect of the shoulders 27 and in most cases will provide sufficient securement for the control unit. It is, of course, understood that all of the spring fingers need not be soldered to grounding leads and that the mere application of solder to the projecting ends of the fingers 25 will be sufficient to effect this holding function.

Where added securement is needed, as for instance in portable radio receivers which are apt to be subjected to severe jarring, such added support may be easily provided by fastening a pair of apertured attaching ears 31 which extend in opposite directions from the ground plate 10, to a supporting wall (not shown). The supporting wall to which the ears are fastened will have the operating shaft 8 projecting therethrough and may be part of the receiver chassis or some special bracket fixed to the chassis or the printed circuit panel.

Figures 5, 6:
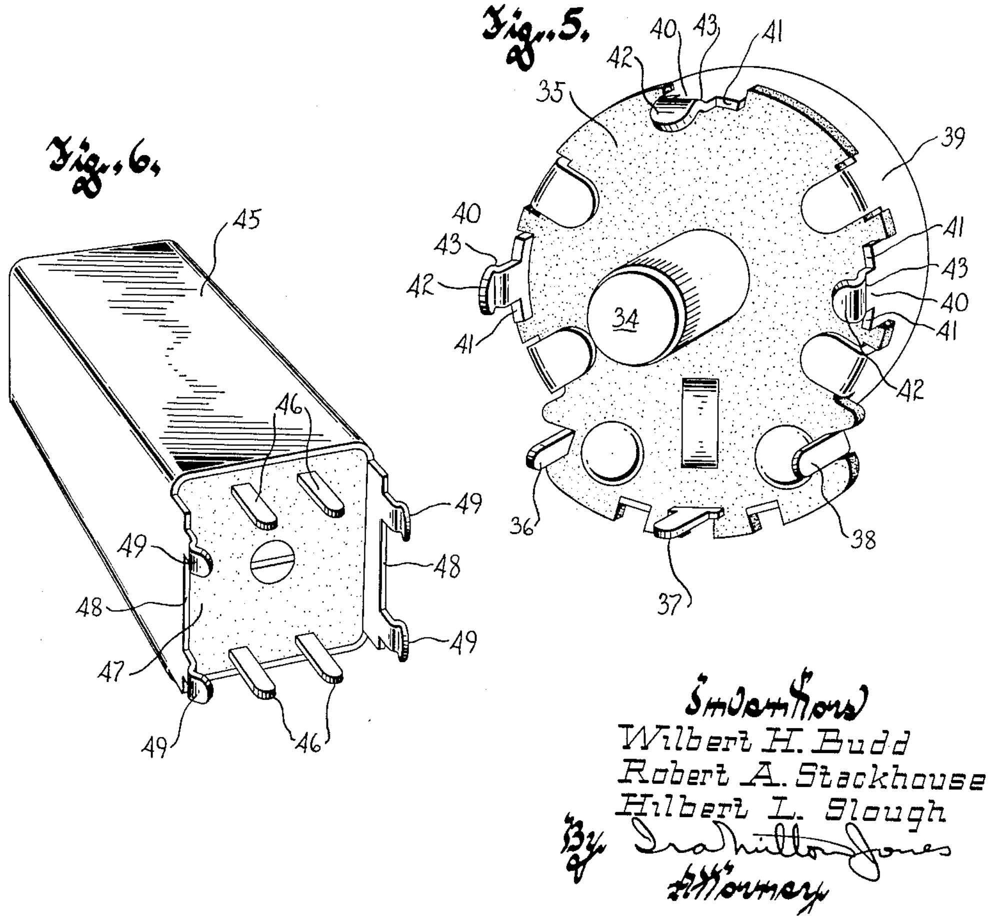
Figure 5 is a perspective view of a variable resistor having a modified adaptation of this invention applied thereto.
Figure 6 is a perspective view of a metal encased I. F. coil illustrating how this invention may be adapted to television and radio circuit components other than variable resistors and combined volume controls and switches.

For circuit components which ordinarily are not equipped with ground plates, the snap-in mounting feature of the invention may be employed as shown for instance in Figures 5 and 6. Figure 5 illustrates a variable resistor of the type often used for preset controls wherein a short stub shaft 34 projects from the base 35 of the instrument to protrude through a panel (not shown) upon which the unit is to be mounted. The terminals 36, 37 and 38 of the resistor also project from the base 35 in the same direction as the shaft 34.

To secure the unit in place on the panel with its terminals in position to be soldered to their respective leads, the cup-shaped metal casing 39 which coacts with the base 35 to house the control instrumentalities has a plurality of short supporting legs 40, the bottoms of which provide panel engaging surfaces 41 all lying in a common plane normal to the control shaft and inwardly of the outer ends of the shaft and the terminals. Spring fingers 42 project from these short legs 40 and extend beyond the supporting surfaces 41. Like the fingers 25 these spring fingers 42 are formed with shoulders 43 to coact with the surfaces 41 to hold the unit on the panel with its terminals and shaft protruding therethrough, when the fingers are snapped into appropriately shaped and located holes in the panel.

A similar adaptation of this invention is illustrated in Figure 6 where it is applied to the mounting of an I. F. coil which, as is customary, is enclosed within an oblong metal casing 45. In this instance the terminals 46 of the component project down from the bottom wall 47 thereof and at least two opposite side walls of the casing 45 project below the bottom 47 with the edges 48 thereof serving as supporting surfaces adapted to rest on or seat against a mounting panel. Spring detent fingers 49 project from these edges 48 to have snap-in engagement with appropriately located holes in the panel and coact with the edges 48 to hold the unit or component in position on the panel in the manner already described.

From the foregoing description taken in connection with the accompanying drawings, it will be readily apparent that this invention provides a simple though highly effective manner of quickly and easily mounting any component of a radio or television receiver circuit on a printed circuit panel with the terminals of the component protruding through holes in the panel for soldered connection with the leads by which such terminals are connected to their respective circuits.

What we claim as our invention is:

1. A variable resistor of the type wherein the instrumentalities thereof are enclosed within a housing having a front wall from which a rotatable control shaft projects, characterized by the provision of: a metal mounting means fixed with respect ot the housing and provided with supporting legs extending from the housing in a direction substantially crosswise of the control shaft axis, said legs having panel engaging abutments thereon with surfaces lying in a common plane substantially parallel to the axis of the control shaft; terminals for the variable resistor projecting therefrom in the same direction as the supporting legs and extending beyond said common plane of the panel engaging surfaces of the abutments; and snap-in fingers on the supporting legs projecting beyond the panel engaging surfaces of said abutments to have detent-like engagement in holes in a panel against which the panel engaging surfaces of the abutments bear, to thereby coact with said abutments to hold the variable resistor in position on the panel with its terminals received in holes therein.

2. In a control unit of the character described: a housing in which the instrumentalities of the unit are enclosed, said housing having an insulated front wall; a rotatable control shaft passing through said front wall; terminals on said front wall, all extending in the same direction parallel to the wall toward and beyond one side of the housing; a mounting bracket for the unit having a pair of legs and a web portion connecting the legs, said legs having panel engaging surfaces remote from the web portion and all lying in a common plane; means securing the mounting bracket to the housing with the web portion of the bracket overlying the front wall of the housing to provide a ground plate for the unit and with the legs of the bracket embracing the unit and the common plane of the panel engaging surfaces intersecting the terminals; a bushing on the web portion of the bracket in which the control shaft is journalled, the axis of said bushing being parallel with said plane of the panel engaging surfaces; and spring fingers projecting from the legs beyond the panel engaging surfaces to have detent-like engagement in holes in a panel against which the panel engaging surfaces bear, to thereby coact with said panel engaging surfaces to hold the unit in place on the panel with its terminals protruding through holes in the panel and with its control shaft parallel to the panel.

3. The variable resistor set forth in claim 1 further characterized by the fact that said mounting means comprises a bracket having angularly disposed portions providing the supporting legs and having a mounting wall overlying the front wall of the housing to provide a ground plate; and means securing said bracket to the housing.

4. In a control unit of the character described: a housing in which the instrumentalities of the unit are enclosed, said housing having an insulated front wall; a rotatable control shaft passing through said front wall; terminals on said front wall, all extending in the same direction parallel to the wall toward and beyond one side of the housing; a mounting bracket for the unit having a pair of legs and a web portion connecting the legs, said legs having panel engaging surfaces remote from the web portion and all lying in a common plane; means securing the mounting bracket to the housing with the web portion of the bracket overlying the front wall of the housing to provide a ground plate for the unit and with the legs of the bracket embracing the unit and the common plane of the panel engaging surfaces intersecting the terminals; a bearing at the front wall of the housing in which the control shaft is journalled, the axis of said bearing being parallel with said plane of the panel engaging surfaces; and attaching means projecting from said legs beyond the panel engaging surfaces thereof and adapted to extend through holes in a panel against which the panel engaging surfaces bear to provide for securing the unit in place on the panel with said panel engaging surfaces in engagement with the panel and with the terminals of the unit protruding through other holes in the panel and the control shaft of the unit parallel to the panel.

5. In a circuit component for radio and television sets having a rotatable control shaft: supporting means for the component fixed with respect thereto and having panel engaging abutments with surfaces thereon lying in a common plane spaced from the control shaft but parallel to its axis, said abutments being adapted to seat upon a panel and thereby position the control shaft of the component at a definite distance from the panel; terminals for the component projecting therefrom substantially perpendicularly to and beyond said plane of the panel engaging surfaces of said abutments whereby said terminals are adapted to enter holes in a panel upon which the abutments seat; and snap-in fingers on the supporting means projecting therefrom beyond the plane of the panel engaging surfaces of the abutments to have detent like engagement in holes in a panel upon which the abutments seat, and thereby coact with said abutments to hold the component on the panel with its control shaft and terminals properly positioned with respect to the panel.

6. In a variable resistor having a housing with a metal ground plate extending across the front thereof and fixed with respect thereto and having a rotatable control shaft projecting from the front of the housing, supporting means for attaching the variable resistor to a panel with its control shaft parallel to the panel and spaced a definite distance therefrom, said supporting means comprising: a supporting leg carried by the ground plate and extending therefrom in a direction crosswise to the axis of the control shaft; a panel engaging abutment on said supporting leg having a surface facing away from the control shaft and lying in a plane spaced therefrom but parallel to the axis of the shaft; another supporting leg fixed with respect to the housing and extending in the same direction as said first designated supporting leg, but in spaced relation thereto; a panel engaging abutment on said other supporting leg likewise having a surface facing away from the control shaft and lying in said plane; snap-in fingers projecting away from the shaft and beyond said plane to pass through holes in a panel upon one face of which the abutments may be seated, said snap-in fingers having shoulders facing towards the shaft but spaced from said plane for engagement with the opposite face of the panel to thereby coact with said abutments in holding the variable resistor in position on the panel; and terminal members for the variable resistor perpendicular to said plane and extending away from the control shaft and beyond said plane whereby said terminal members are adapted to enter holes in a panel upon which the abutments may be seated.

References Cited in the file of this patent

UNITED STATES PATENTS

| | | |
|---|---|---|
| 2,059,813 | Schellenger | Nov. 3, 1936 |
| 2,063,343 | Schellenger et al. | Dec. 8, 1936 |
| 2,566,666 | Khouri et al. | Sept. 4, 1951 |

FOREIGN PATENTS

| | | |
|---|---|---|
| 780,250 | France | Apr. 20, 1935 |